United States Patent [19]

Trethewey

[11] Patent Number: 4,679,042
[45] Date of Patent: Jul. 7, 1987

[54] BAR/DOT LEVEL METER

[75] Inventor: Paul M. Trethewey, Penn Valley, Calif.

[73] Assignee: The Grass Valley Group, Inc., Grass Valley, Calif.

[21] Appl. No.: 725,604

[22] Filed: Apr. 22, 1985

[51] Int. Cl.$^4$ .................. G01R 19/04; G09G 3/14
[52] U.S. Cl. .................. 340/754; 340/815.11; 340/753; 381/56
[58] Field of Search .......... 340/754, 753, 782, 815.11; 381/1, 56; 324/114, 115

[56] References Cited

U.S. PATENT DOCUMENTS

| | | | |
|---|---|---|---|
| 3,701,123 | 10/1972 | Barrett et al. | 340/753 |
| 4,322,758 | 3/1982 | Ohya et al. | 340/753 |
| 4,528,501 | 7/1985 | Dorrough et al. | 324/122 |

FOREIGN PATENT DOCUMENTS 0044576  4/1979  Japan .................. 340/753

OTHER PUBLICATIONS

"Driving Circuits for LED Displays," Elekronikschau (Germany), vol. 55, No. 3, (1979).
"LED Display Scales Having Increased Range;" Elektron, Entwickl. (Germany), vol. 15, No. 9, (Sep. 1980).
"Drive Circuits for LED-Scales with Linear and Logarithmic Response," Elektron, Int. (Austria), No. 11, (1980).
Clarke et al., "Build This LED Paragraph Display", Electronics, Austria, Dec. 1981, vol. 43, No. 12.
Maida, "Dot/Bar-Graph Display Drivers" Radio-Electronics, vol. 51, No. 10, pp. 96–99, 104, (Oct. 1980).

*Primary Examiner*—Gerald L. Brigance
*Attorney, Agent, or Firm*—John Smith-Hill; Francis I. Gray

[57] ABSTRACT

A device for providing a visual indication of the value of a variable of an electrical signal has a plurality, n, of driver circuits each having an input terminal for receiving the electrical signal and a plurality, m, of output terminals. Each driver circuit is operable in a mode in which it provides an output signal at its ith output terminal when the value of the variable lies in a range corresponding to the ith increment on a scale of m increments. The position of the scale of m increments associated with each circuit is adjustable so that the scale of m increment associated with the jth driver circuit overlaps by ((m−1+(n−1)/n) increments the scale of m increments associated with at least one of the (j−1)th circuit and the (j+1)th circuit. Light emitting elements, arranged in an interdigitated grand linear array, are coupled to respective output terminals of the driver circuits.

4 Claims, 3 Drawing Figures

BAR/DOT LEVEL METER

This invention relates to a device for providing a visual indication of the value of a variable of an electrical signal.

BACKGROUND OF THE INVENTION

It is common for an audio recording or reproduction machine to include a device for providing a visual indication of signal level. This indication might serve to show that the signal level is adequate for the sensitivity of the particular recording machine, or it might be used to show whether the signal amplitude is so large that it cannot be recorded or reproduced, as the case may be, without introducing distortion. Such a loudness or VU (volume unit) monitor may have, as its optical readout element, a simple LED or a deflectable needle.

In some circumstances, it is desirable to be able to provide more detailed information than can be given using a simple LED or deflectable needle. For example, in more sophisticated audio recording machines it is desirable to provide an indication of both average audio signal level and peak audio signal level. One type of VU meter that is able to provide both average and peak signal levels comprises a linear (rectilinear or curvilinear) array of LEDs that form a bar graph and moving dot, representing average and peak signal levels respectively. The bar and dot are shown simultaneously, so that the user of a recording machine including such a device can see immediately, without adjusting controls, both the average level and the peak level of the received audio signal.

There are commercially available integrated circuits that are suitable for driving such an array of LEDs. For example, integrated circuit type LM 3914, available from National Semiconductor Corporation, has ten output pins that can be used to provide output signals to ten LEDs and has a mode select pin whereby the circuit may be placed either in a mode for displaying a bar or a mode for displaying a dot.

In a known VU meter, the input audio signal is applied to an average AC to DC converter and to a peak AC to DC converter, in order to provide DC signals representative of the average signal level and the peak signal level respectively. The two DC signals are applied to respective logarithmic conversion circuits so as to generate DC signals representative of the average signal level and the peak signal level in decibels. The DC signal representing the peak signal level in decibels is applied to each of a first group of four LM 3914 integrated circuits operating in the dot mode, and the DC signal representing the average audio signal level in decibels is applied to each of a second group of four LM 3914 integrated circuits operating in the bar mode. Reference voltage levels are applied to the ICs such that the forty output pins from each group of four ICs are associated with respective 1 dB increments in input signal level, the two forty dB ranges covered by the two groups of four ICs being the same. The two pins (average and peak) corresponding to each increment in signal level are connected together and are connected to an LED. The resulting forty LEDs are placed in order of signal level in a curvilinear array.

In the dot mode, the LM 3914 circuit provides an output at a single pin when the input signal lies within the range associated with that pin, whereas in the bar mode it provides an output signal at all pins associated with increments in the signal level up to and including the increment in which the input signal lies. Thus, this known VU meter results in the LEDs providing an indication in the form of an illuminated bar of the average signal level and an indication, in the form of an illuminated dot, or small group of dots, of the peak signal level. Since, in a normal audio signal, the peaks are 8 dB or more above the average signal level, the bar and the dot provide distinct, and simultaneous, visual indications of the peak signal level and the average signal level.

A problem that arises with the known VU meter is that the individual ICs in each group of four ICs are associated with different signal ranges and consequently they operate over different ranges of input and load, causing poor thermal tracking. Moreover, the ICs of the second group, since normally they each drive multiple LEDs, operate at relatively high temperatures and therefore utilize a ceramic package, which is more expensive than the molded package that can be used for ICs that operate at lower temperatures.

SUMMARY OF THE INVENTION

In accordance with the present invention, a device for providing a visual indication of the value of a variable of an electrical signal comprises a plurality, n, of driver circuits each having an input terminal for receiving the electrical signal and a plurality, m, of output terminals. Each driver circuit is operable in at least a first mode in which it provides an output signal at at least its ith output terminal (where i lies in the range from one to m) when the value of the variable lies within a range corresponding to the ith increment on a scale of m increments. The device also comprises n linear arrays of m light emitting elements associated with the n driver circuits respectively, with the ith element of each array coupled to the corresponding ith output terminal of the associated driver circuit and positioned in the array between the (i+1)th element and the (i−1)th element. The elements of the n arrays are interdigitated to form a linear grand array of m×n light emitting elements with the ith element of the jth array (where j lies in the range from one to n) adjacent at least one of the ith element of the (j+1)th array, the ith element of the (j−1)th array, the (i+1)th element of the first array and the (i−1) th element of the nth array. The device further comprises means whereby the driver circuits are adjusted so that the scale of m increments associated with the jth driver circuit overlaps by ((m−1)+(n−1)/n) increments the scale of m increments associated with at least one of the (j−1)th circuit and the (j+1)th circuit.

In the Summary of the Invention and in the appended claims, references to light emitting elements, and arrays thereof, that are identified by numbers that are not allowed are intended to be omitted. Thus for i equal to m, there is no allowed value of (i+1) and the reference to the ith element being positioned between the (i−1)th element and the (i+1)th element is intended to mean that the ith element is positioned adjacent the (i−1)th element.

A preferred embodiment of the invention comprises a multiplexer for applying two electrical signals alternately to the input terminals of the driver circuits, and each driver circuit is switchable between the first mode of operation and a second mode of operation in which it provides an output at all of its first to ith output terminals when the value of the variable lies within the range corresponding to the ith increment. The switching between modes is synchronized with the switching by the multiplexer between the two signals, so that an indication of the value of the variable of one signal is provided in the first mode and an indication of the value of the variable of the other signal is provided in the second mode.

In a preferred embodiment of the invention, in which the invention is applied to a VU meter, the driver circuits are switched between their first and second modes of operation at a rate such that the device appears to be providing the two distinct visual indications simultaneously, and the signal that is applied to the driver circuits when they are operating in their first mode represents the peak value of an input signal whereas the signal that is applied when the circuits are operating in their second mode represents the average value of the same input signal, the input signal being the audio signal that is being monitored. The preferred device comprises three driver circuits each having ten output terminals. In addition, each driver circuit has an internal linear to logarithmic converter, and accordingly the display provided by the light emitting elements is representative of the signal level and average signal level in decibels.

BRIEF DESCRIPTION OF THE DRAWINGS

For a better understanding of the invention, and to show how the same may be carried into effect, reference will now be made, by way of example, to the accompanying drawings in which.

DETAILED DESCRIPTION

Figure 1:
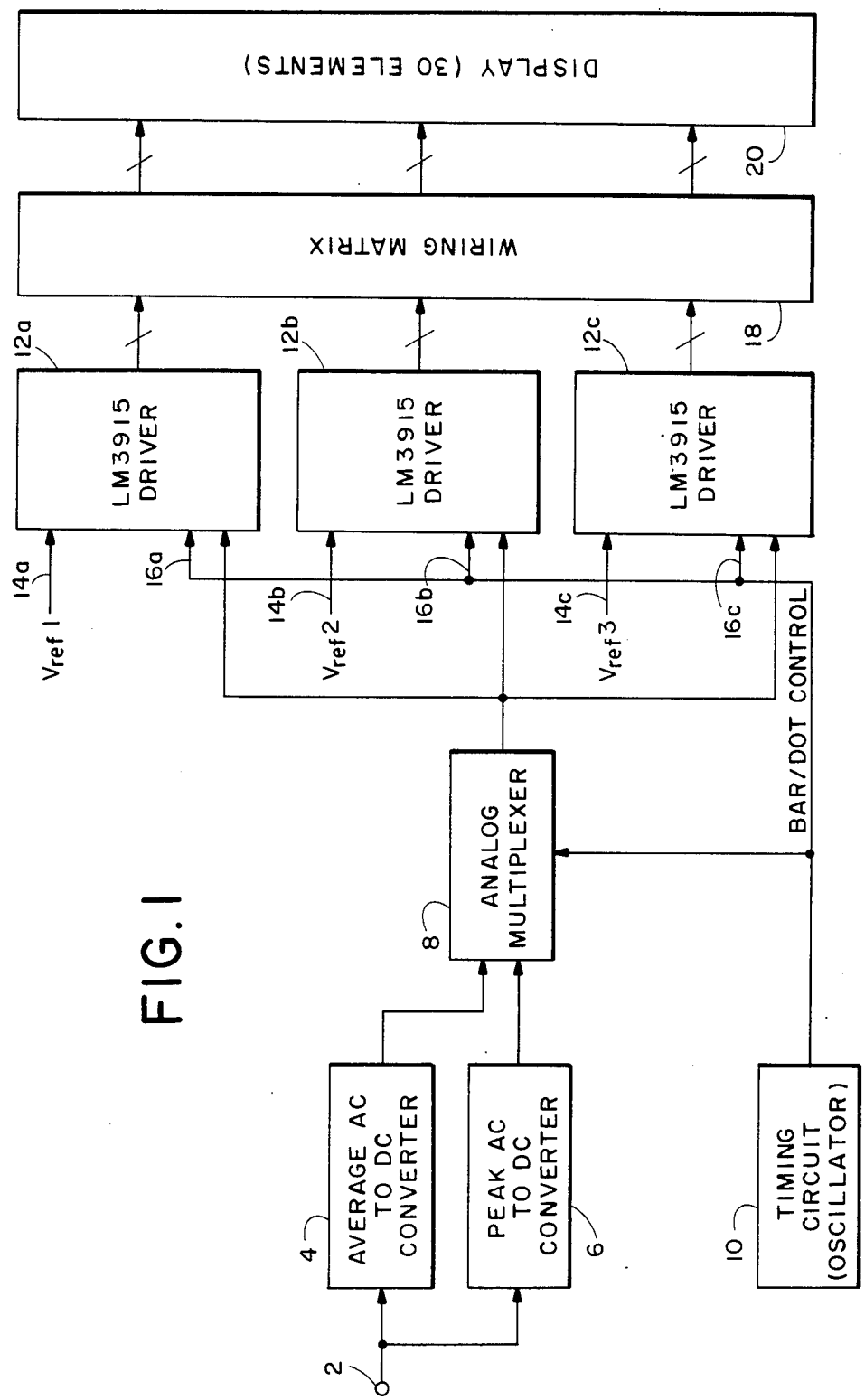
FIG. 1 is a block diagram of a first embodiment of the present invention.

FIG. 1 illustrates in block form a VU meter having an input terminal 2 at which an audio signal is received. The audio signal is applied to both an average AC to DC converter 4 and a peak AC to DC converter 6, the converters 4 and 6 providing at their outputs signals representative, respectively, of the average audio signal level and the peak audio signal level. These two DC signals are applied to an analog multiplexer 8. The analog multiplexer 8 operates under control of an oscillator 10 to select the signals provided by the converters 4 and 6 alternately and to apply the selected signal to each of three LM 3915 integrated circuits 12. Each of the integrated circuits 12 has two additional inputs that are pertinent to the present invention, namely a reference voltage pin 14 and a mode select pin 16. Each circuit 12 has ten output pins associated with respective increments in the level of the input signal received from the analog multiplexer 8. The circuit 12a, for example, provides an output at that pin which is associated with the signal level increment in which the input signal level lies when the circuit 12a is placed in the dot mode by the voltage level applied to the pin 16a, and provides an output signal at the pin associated with the signal level increment in which the input signal level lies, and all pins associated with lower increments, when the voltage applied to the pin 16a places the circuit in its bar mode.

The circuits 12 are switched between the bar mode and the dot mode by the output of the oscillator 12, synchronously with the switching of the multiplexer 8. Thus, when the converter 4 is selected by the multiplexer 8, the circuits 12 are placed in the bar mode whereas when the converter 6 is selected by the multiplexer the circuits 12 are placed in the dot mode.

Each of the circuits 12 comprises a precision ten-stage comparator that compares the input signal with ten logarithmically-spaced reference voltages in order to determine which output pins should receive a signal. It will therefore be appreciated that the signal increments associated with the respective output pins are not equal but are logarithmically related.

Figure 3:
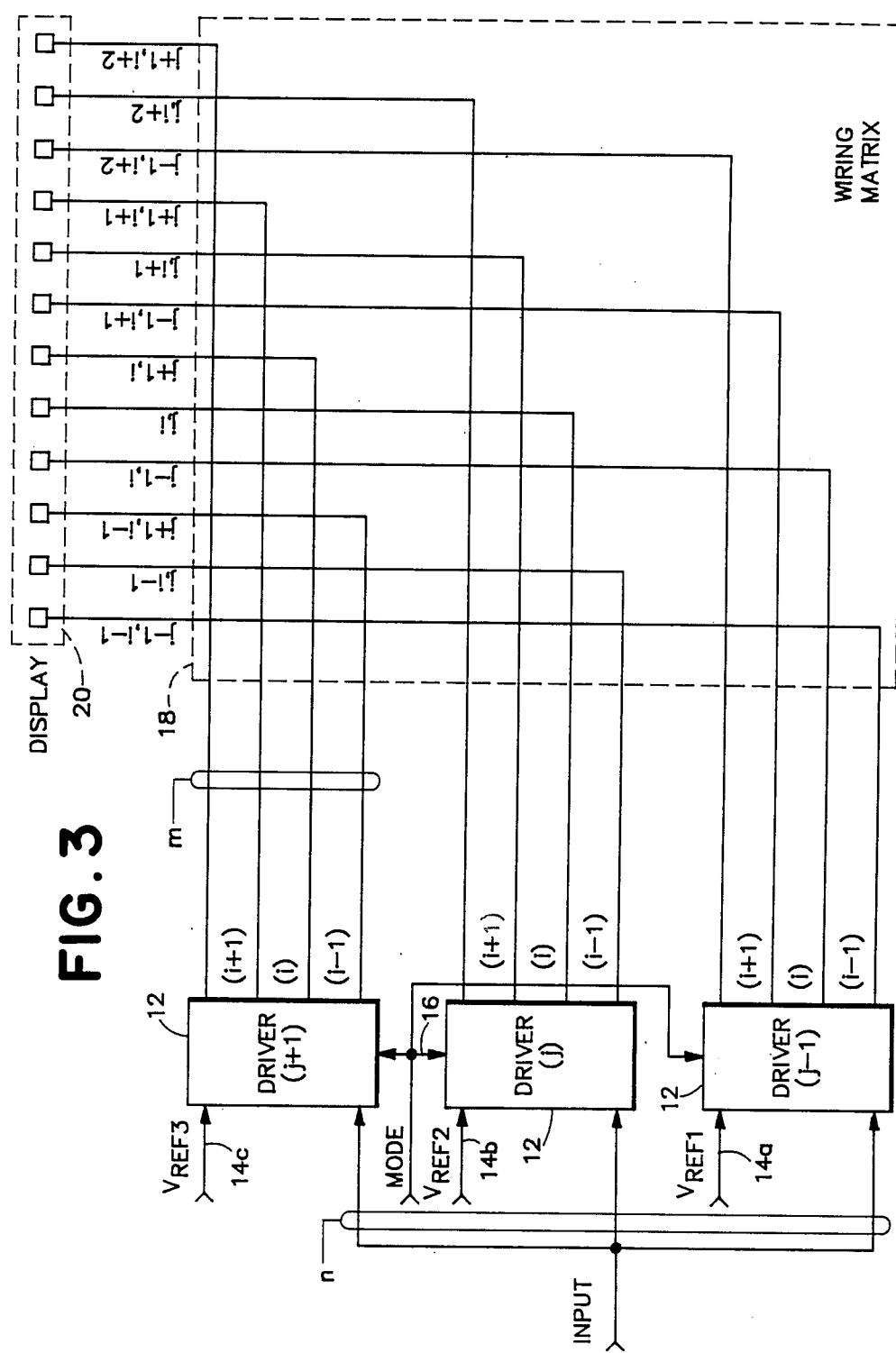
FIG. 3 is a block diagram of a portion of a device according to the present invention illustrating the interdigitation and substantial overlapping of values for the driver circuits.

Each circuit 12 contains an adjustable voltage reference and a ten-step voltage divider, establishing the reference voltages for the comparators. The reference voltages for the three circuits 12 are adjusted so that the internal comparator thresholds for each circuit are offset by 1 dB from each other. Thus, the thresholds of the circuit 12a are higher by 1 dB than the thresholds for the circuit 12b, which in turn are higher by 1 dB than the thresholds for the circuit 12c. The total of thirty output pins of the circuits 12 are connected through a wiring matrix 18 to a display comprising thirty LEDs. The wiring matrix, as illustrated in FIG. 3, serves to interdigitate the output pins of the circuits 12, with respect to their connections to the LEDs, so that the pins are connected to respective LEDs and successive pins of each circuit are connected to every third LED.

The thirty LEDs of the display 20 may be considered to be made up of three interdigitated linear arrays of ten LEDs each, which together form a linear grand array.

It will be appreciated from the foregoing that the display 20 will provide a bar and dot display, in which each LED represents an increment of 1 dB in input signal level and the dot, which is formed by three adjacent LEDs, represents peak signal level whereas the bar represents average signal level.

It will be appreciated that the VU meter described with reference to FIG. 1 has the advantage over the previously-known meter in that each of the circuits 12 operates within approximately the same range of input and load, and therefore operates at approximately the same temperature. Accordingly, errors introduced by operating the different integrated circuits at different temperatures are reduced. In addition, by multiplexing the outputs of the converters 4 and 6 and switching the circuits 12 between the bar mode and the dot mode, the number of integrated circuits is reduced and so is the current consumption, and therefore the less expensive molded plastic packaging can be used for all the LM 3915 ICs.

Figure 2:
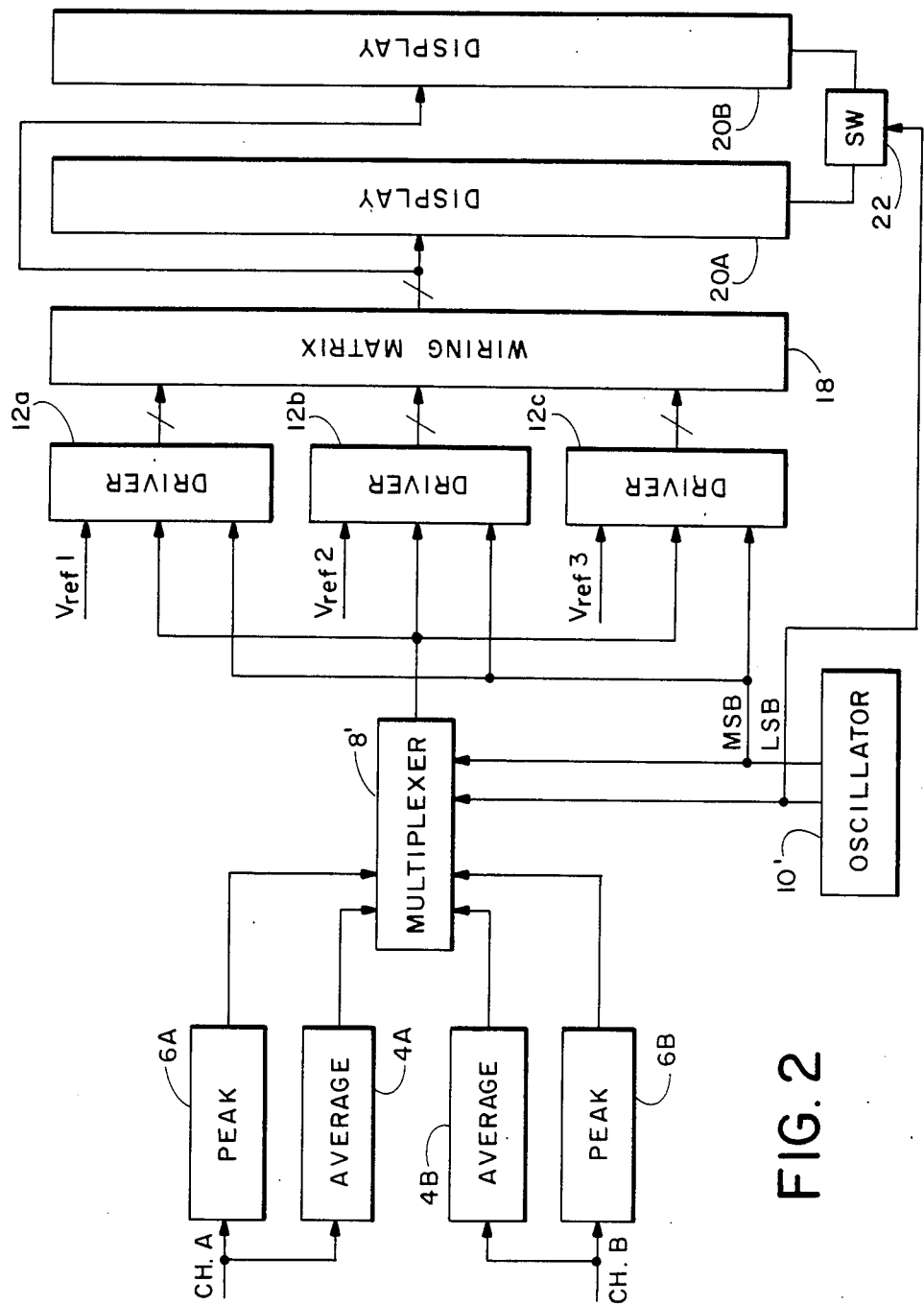
FIG. 2 a block diagram of a second embodiment of the present invention.

Multiplexing also allows a single set of LED driver circuits to provide displays relating to two channels, as in the case of the VU meter shown in FIG. 2. The device shown in FIG. 2 provides peak and average level indications for each of two audio signals, indicated as channels A and B. Elements of FIG. 2 that are associated with the channels A and B are designated by the suffixes A and B respectively, and in FIGS. 1 and 2 like elements are designated by like reference numerals.

In the device of FIG. 2, the multiplexer 8' is a 4 to 1 multiplexer, and may be integrated circuit type MC 14052. The multiplexer 8' is controlled by a two bit digital signal generated by an oscillator 10, which comprises an astable multivibrator that generates the least significant bit (LSB) and drives a D flip-flop that generates the most significant bit (MSB).

The LSB of the oscillator output causes the multiplexer 8' to select between channel A and channel B, while the MSB causes the multiplexer to select between peak and average. Thus, in one period of the two bit signal, the multiplexer selects each of its four signal inputs for one half-cycle of the LSB.

The MSB is also applied to the mode select input of the circuits 12, and thus determines whether the circuits 12 are in the bar mode or in the dot mode. The voltage levels of the MSB are such that the circuits 12 are in the bar mode when the multiplexer selects the average signal level whereas the circuits 12 are in the dot mode when the multiplexer selects the peak signal level.

The LSB of the oscillator output is used to determine which of the LED arrays 20A and 20B is selected. This is accomplished using a switch 22 through which the LEDs are connected to their power supply rail, so that when the switch selects the array 20A the array 20B is disabled, and vice versa. The switch 22 is arranged to select the array 20A when the multiplexer selects channel A, and to select the array 20B when the multiplexer selects the channel B.

The frequency of the LSB pulse train is about 780 Hz, and therefore when the device shown in FIG. 2 is in operation it appears to the human eye that both arrays 20A and 20B are simultaneously driven, and that each array is simultaneously driven in both the bar mode and the dot mode.

It will be appreciated from the foregoing that the device shown in FIG. 2 is able to provide a visual indication of peak and average signal levels for two input audio signals. The spacing between the dot and bar of each display is an indication of the ratio of peak signal level to average signal level. Thus, the device shown in FIG. 2 provides an easily interpreted comparison between the signals provided on two channels, and can be used to facilitate matching of signal levels prior to switching from one channel to the other.

It will be appreciated that the invention is not restricted to the particular devices that have been described and illustrated, and that variations may be made therein without departing from the scope of the invention as defined in the appended claims, and equivalents thereof. For example, in the event that it is desired that the increments in signal level associated with the respective pins of the circuits 12 be equal instead of related logarithmically, a circuit, such as the integrated circuit type LM 3914 that does not have a logarithmic conversion function, could be used. It is not essential that the invention be applied to the measurement of audio signal levels, since numerous other applications exist for circuits such as types LM 3914 and LM 3915. It is not essential that the input signals to the circuits 12 be different variables, such as peak and average level, of the same input signal, since there are other applications in which it might be desirable to display for simultaneous view indications of signal levels representing variables of entirely independent signals. Finally, it is not essential that the display be a bar and dot display, since, for example, the circuits 12 could address different arrays of light emitting elements in the two modes respectively. For example, in a case where it is desired that distinct indications be given of one variable of each of two signals, the driver circuits could cause each of two arrays to provide a dot display.

I claim:

1. A device for providing a visual indication of the value of a variable of an electrical signal, comprising:

a plurality, n, of driver circuits each having an input terminal for receiving said electrical signal and a plurality, m, of output terminals, and each driver circuit being operable in at least a first mode in which it provides an output signal at at least its ith output terminal (where i lies in the range from one to m) when the value of said variable lies within a range corresponding to the ith increment on a scale of m increments;

n linear array of m light emitting elements, each linear array being associated with respective ones of the n driver circuits, with the ith element of each linear array being coupled to the ith output terminal of the driver circuit associated therewith and being positioned in the linear array between the (i−1)th element and the (i+1)th element, the elements of the n linear arrays being interdigitated to form a linear grand array of m×n light emitting elements with the ith element of the jth array (where j lies in the range from one to n) being adjacent at least one of the ith element of the (j+1)th array, the ith element of the (j−1)th array, the (i+1)th element of the first array and the (i−1)th element of the nth aray; and means whereby said driver circuits are adjusted so that the scale of m increments associated with the jth driver circuit overlaps by ((m−1)+(n−1)/n) increments the scale of m increments associated with at least one of the (j−1)th circuit and the (j+1)th circuit.

2. A device according to claim 1, wherein each driver circuit is switchable between its first mode of operation and a second mode of operation in which it provides an output at all of its first to ith output terminals when the value of the variable lies within the range corresponding to the ith increment, the device further comprising a multiplexer for applying two electrical signals alternately to the input terminals of the driver circuits, and means for switching the driver circuit alternately to the first mode and the second mode synchronously with the switching of the multiplexer between the two electrical signals.

3. A device for providing a visual indication of the value of a variable of an electrical signal, comprising:

a plurality, n, of driver circuits each having an input terminal for receiving said electrical signal and a plurality, m, of output terminals, and each driver circuit being operable in at least a first mode in which it provides an output signal at at least its ith output terminal (where i lies in the range from one to m) when the value of said variable lies within a range corresponding to the ith increment on a scale of m increments;

two linear grand arrays of light emitting elements connected to parallel to the output terminals of the driver circuits, each grand array having n linear arrays of m light emitting elements, corresponding ones of the linear arrays of each grand array being associated with each of the n driver circuits, with the ith element of each array being coupled to the ith output terminal of the associated driver circuit and being positioned in the linear array between the (i−1)th element and the (i+1)th element, the elements of the n linear arrays of each grand array being interdigitated so that the ith element of the jth array (where j lies in the range from one to n) is adjacent at least one of the ith element of the (j+1)th array, the ith element of the (j−1)th array, the (i+1)th element of the first array and the (i−1)th element of the nth array;

means whereby said driver circuits are adjusted so that the scale of m increments associated with the jth driver circuit overlaps by $((m-1)+(n-1)/n)$ increments the scale of m increments associated with at least one of the (j−1)th circuit and the (j+1)th circuit;

a multiplexer for appplying two electrical signals alternately to the input terminals of the driver circuits; and control means for enabling the two grand arrays of light emitting elements alternately, in synchronized relationship with the switching by the multiplexer between the two electrical signals.

4. A device according to claim 3, wherein the multiplexer is operative to apply four electrical signals to the input terminals in a cyclically repeating sequence, and each driver circuit is switchable between its first mode of operation and a second mode of operation in which it provides an output at all of its first to ith output terminals when the value of the variable lies within the range correspondIng to the ith increment, said control means being operative to switch each driver circuit from one mode to the other mode at half the frequency of such cyclically repeating sequence.

* * * * *